(12) United States Patent
Redaelli et al.

(10) Patent No.: US 10,559,337 B1
(45) Date of Patent: Feb. 11, 2020

(54) VERTICAL DECODER

(71) Applicant: Micron Technology, Inc., Boise, ID (US)

(72) Inventors: Andrea Redaelli, Casatenovo (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/206,006

(22) Filed: Nov. 30, 2018

(51) Int. Cl.
*G11C 8/10* (2006.01)
*G11C 5/06* (2006.01)
*G11C 5/02* (2006.01)

(52) U.S. Cl.
CPC .................. *G11C 8/10* (2013.01); *G11C 5/02* (2013.01); *G11C 5/063* (2013.01)

(58) Field of Classification Search
None
See application file for complete search history.

(56) References Cited

U.S. PATENT DOCUMENTS

| | | | | |
|---|---|---|---|---|
| 5,959,336 | A * | 9/1999 | Barsan | G11C 8/08 257/391 |
| 6,566,682 | B2 * | 5/2003 | Forbes | H01L 29/7881 257/302 |
| 10,418,552 | B1 * | 9/2019 | Fantini | H01L 45/06 |
| 2009/0016106 | A1 * | 1/2009 | Tran | G11C 16/28 365/185.05 |
| 2014/0146612 | A1 * | 5/2014 | Helm | G11C 7/18 365/185.18 |

* cited by examiner

*Primary Examiner* — Tan T. Nguyen
(74) *Attorney, Agent, or Firm* — Holland & Hart LLP

(57) ABSTRACT

Methods, systems, and devices for a decoder are described. The memory device may include a substrate, an array of memory cells coupled with the substrate, and a decoder coupled with the substrate. The decoder may be configured to apply a voltage to an access line of the array of memory cells as part of an access operation. The decoder may include a first conductive line configured to carry the voltage applied to the access line of the array of memory cells. In some cases, the decoder may include a doped material extending between the first conductive line and the access line of the array of memory cells in a first direction (e.g., away from a surface of the substrate) and the doped material may be configured to selectively couple the first conductive line of the decoder with the access line of the array of memory cells.

35 Claims, 10 Drawing Sheets

▨ Doped Material  ⊞ Substrate  ▩ Memory Array

VERTICAL DECODER

BACKGROUND

The following relates generally to operating a memory array and more specifically to a vertical decoder.

Memory devices are widely used to store information in various electronic devices such as computers, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Improved solutions for saving space in the memory array, increasing the memory cell density, or decreasing overall power usage of the memory array may be desired.

DETAILED DESCRIPTION

Some memory devices may include a decoder coupled with the memory array. In some cases, the decoder may include one or more doped materials formed in a specific orientation to reduce the array size of the die used by the decoder. For example, the decoder may include doped materials that extend in a direction different from (e.g., perpendicular to) a surface of a substrate. In some cases, the decoder may also include a conductive line. The doped material may extend from the conductive line of the decoder to an access line associated with the memory array. In accordance with teachings herein, the decoder may be coupled with the substrate and configured to apply a voltage to the access line of the memory array. In some cases, the conductive line may be configured to carry the voltage applied to the access line, and the doped material may be coupled with the first conductive line of the decoder with the access line of the memory array.

In some cases, the memory array may be an example of a self-selecting memory array. In some cases, a self-selecting memory array may be fabricated in a three-dimensional fashion and may include vertical memory cells. To save space and resources, the decoder that includes vertical doped materials may be implemented as part of or in the self-selecting memory array. In some examples, the decoders may be examples of row decoders implemented to bias one or more word-lines or examples of column decoders implemented to bias one or more a bit-lines or both. The decoders may be positioned above the memory array, below the memory array, or both. In such cases, the size of the memory array may be reduced based on the placement and/or orientation of the one or more decoders. These and other techniques and advantages described herein may thus improve the size and density of the memory array.

Features of the disclosure introduced above are further described below in the context of a memory array. Specific examples are then described for operating the memory array related to a vertical decoder in some examples. These and other features of the disclosure are further illustrated by and described with reference to an apparatus diagram and flowcharts that relate to techniques for a vertical decoder.

Figure 1:
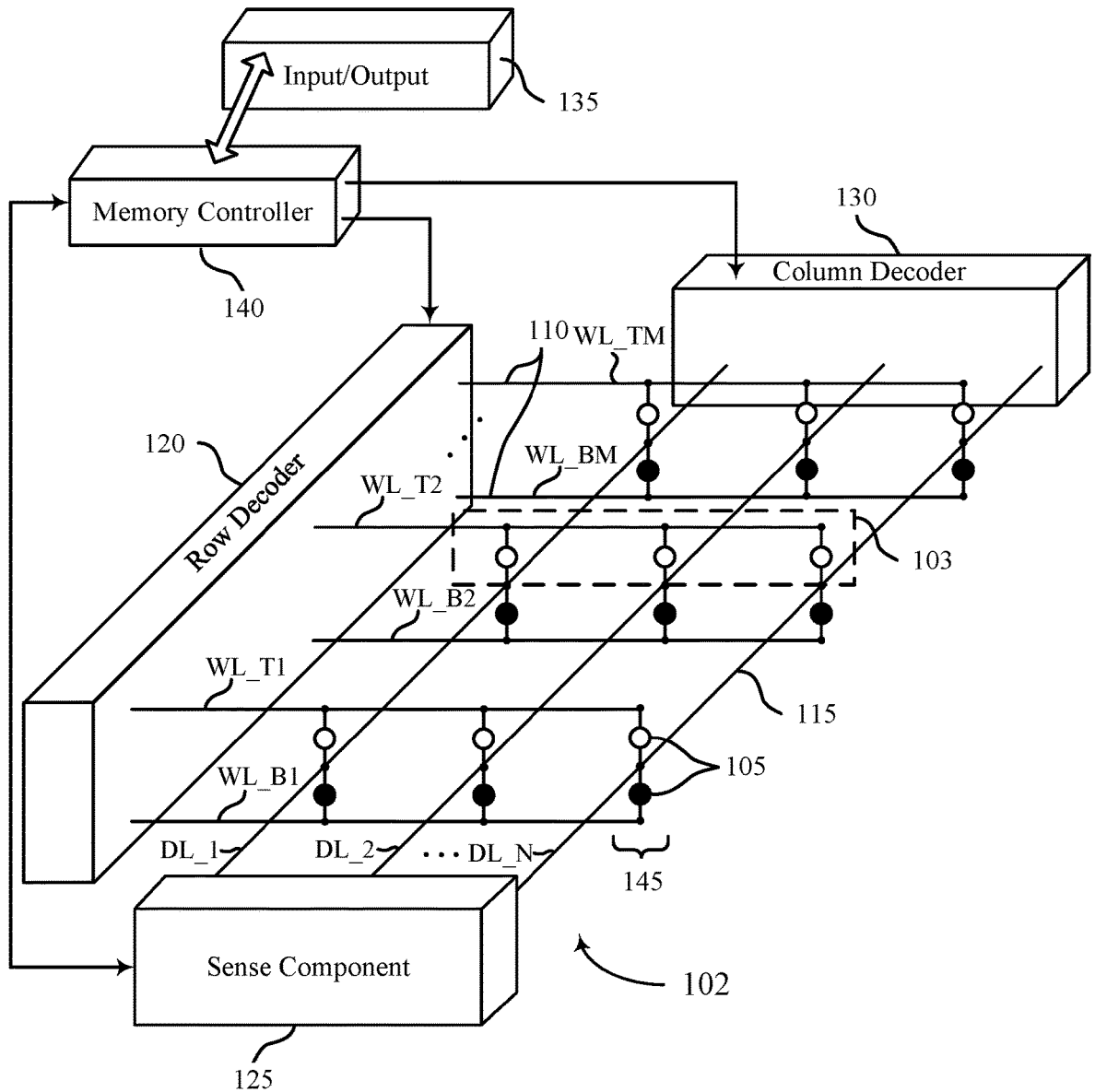
FIG. 1 illustrates an example memory device as disclosed herein.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and bit line 115. In some examples, access lines 110 may also be known as word lines 110, and bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a bit line 115, e.g., WL_2 and DL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purposes.

A memory cell 105 may be set or written by similarly activating the relevant word line 110 and bit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store a logic state in the memory cell 105 by applying the first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with an access line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may be store a logic state in the memory cell 105 based on applying the first voltage to the memory cell 105.

Figure 2:
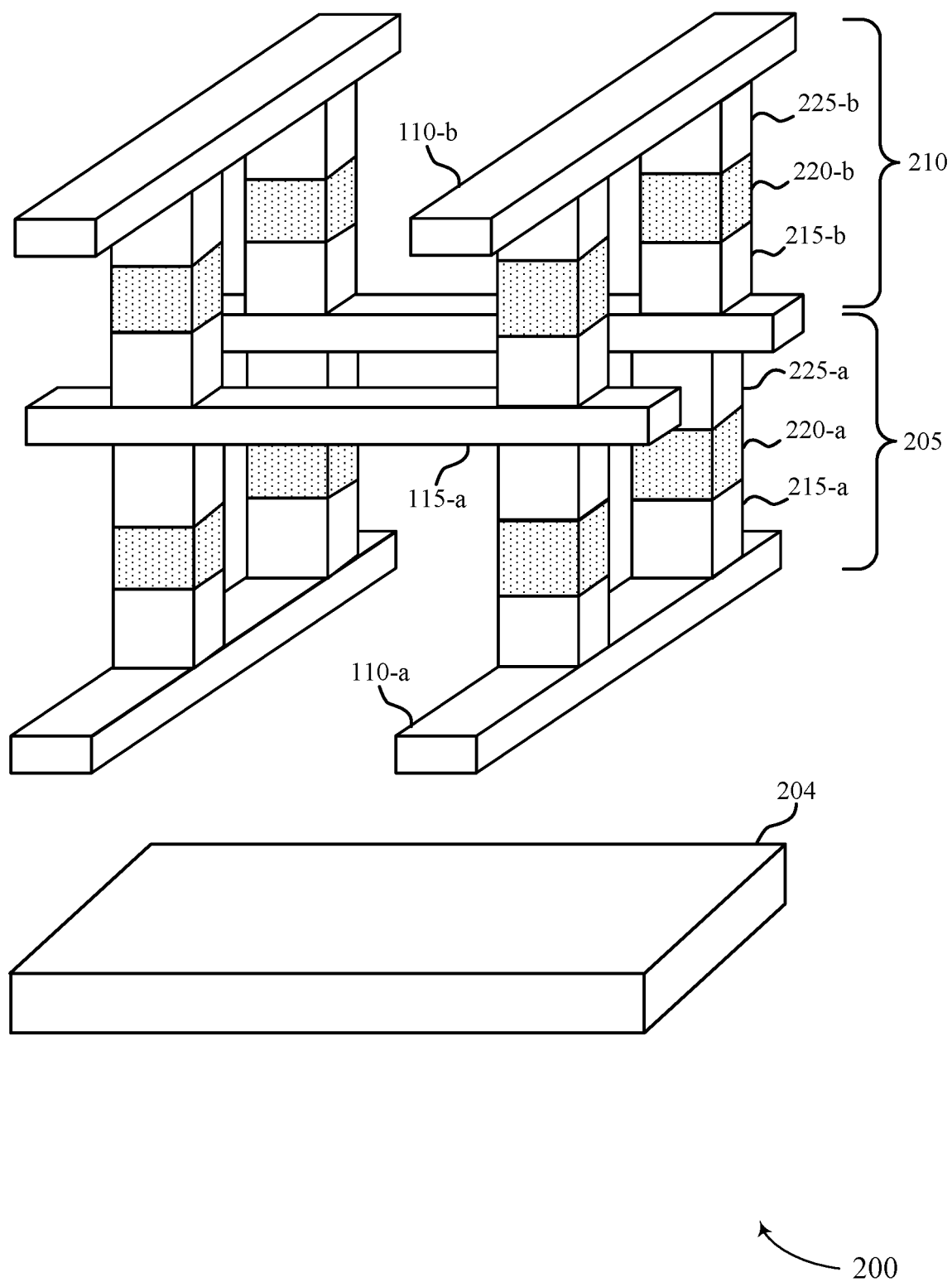
FIG. 2 illustrates an example of a memory array that supports a vertical decoder as disclosed herein.

FIG. 2 illustrates an example of a 3D memory array 200 that supports a vertical decoder as disclosed herein. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-a and word line 110-b, and bit line 115-a, which may be examples of word line 110 and bit line 115, as described with reference to FIG. 1. Memory cells of the first deck 205 and the second deck 210 each may have one or more self-selecting memory cell (e.g., self-selecting memory cell 220-a and self-selecting memory cell 220-b, respectively). Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-a, self-selecting memory cell 220-a (e.g., including chalcogenide material), and second electrode 225-a. In addition, self-selecting memory cells of the second deck 210 may include a first electrode 215-b, self-selecting memory cell 220-b (e.g., including chalcogenide material), and second electrode 225-b. The self-selecting memory cells of the first deck 205 and second deck 210 may, in some examples, have common conductive lines such that corresponding self-selecting memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-a such that bit line 115-a is shared by vertically adjacent self-selecting memory cells. In accordance with the teachings herein, a decoder may be positioned above or below each deck if the memory array 200 includes more than one deck. For example, a decoder may be positioned above first deck 205 and above second deck 210.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of self-selecting memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a self-selecting memory cell 220 that includes chalcogenide material. The self-selecting memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a self-selecting memory cell 220 including chalcogenide material may be programmed to a logic state by applying a first voltage. By way of example, when a particular self-selecting memory cell 220 is programed, elements within the cell separate, causing ion migration. Ions may migrate towards a particular electrode, depending on the polarity of the voltage applied to the memory cell. For example, in a self-selecting memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

For example, if a memory cell has a given distribution of ions, the threshold voltage detected during the read operation may be different for a first read voltage with a first polarity than it is with a second read voltage having a second polarity. Depending on the polarity of the memory cell, this concentration of migrating ions may represent a logic "1" or logic "0" state. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

In some cases, a first voltage may be applied to a first conductive line of a decoder as part of an access operation of the self-selecting memory cell 220. Upon applying the first voltage, the first conductive line may be coupled with the access line (e.g., word line 110-*a*, word line 110-*b*, or bit line 115-*a*) associated with the self-selecting memory cell 220. For example, the first conductive line may be coupled with the access line based on a doped material of the decoder which extends between the first conductive line and the access line in a first direction.

In some examples, the first voltage may be applied to the self-selecting memory cell 220 based on coupling the first conductive line of the decoder with the access line. The decoder may include one or more doped materials that extend between the first conductive line and the access line of the memory array 200 of memory cells in a first direction away from a surface of the substrate 204. In some cases, the decoder may be coupled with the substrate 204.

Figure 3:
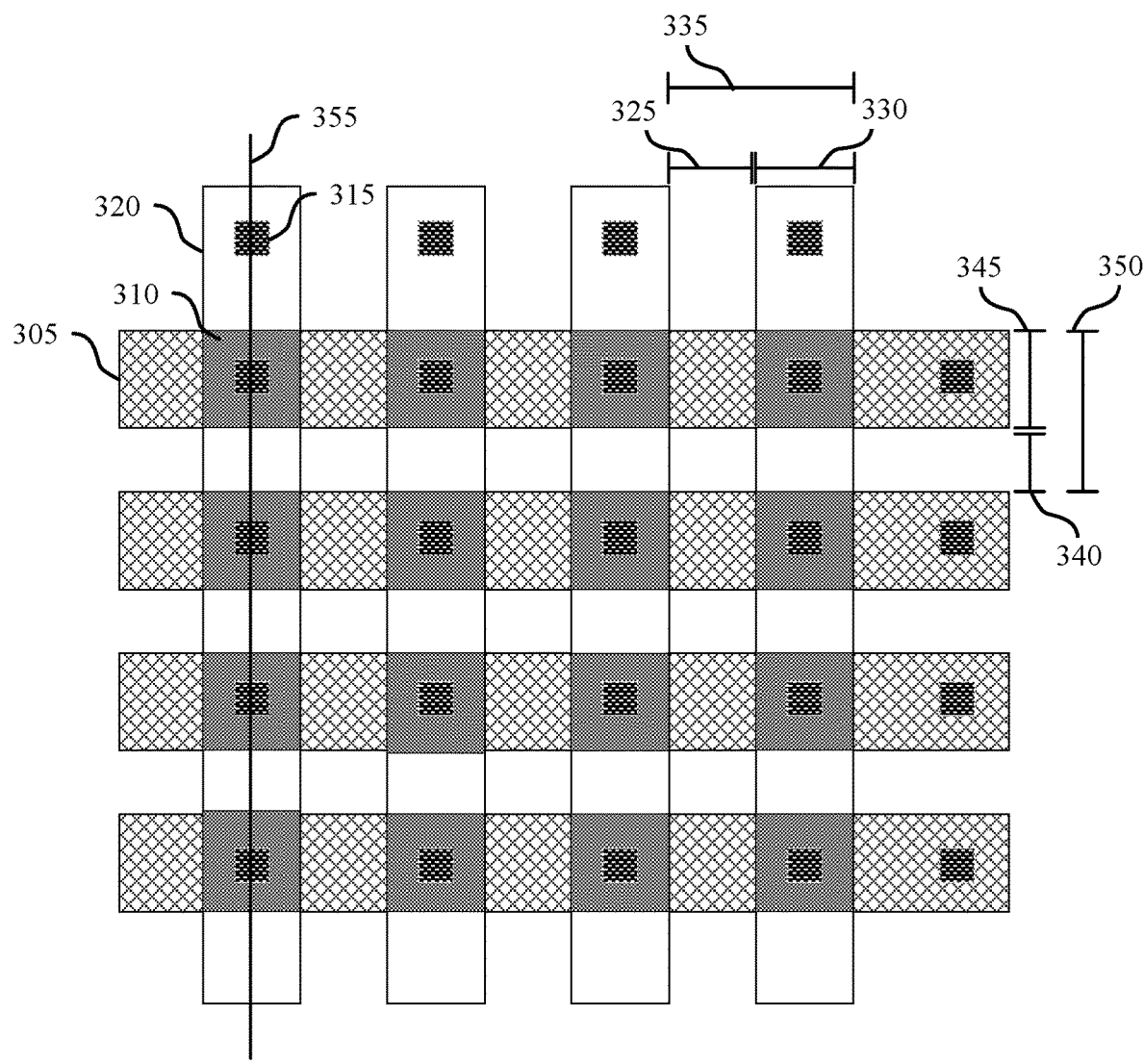
FIG. 3 illustrates an example of a top-down view of a decoder as disclosed herein.

FIG. 3 illustrates an example of a top-down view of a decoder 300 as disclosed herein. Decoder 300 may be an example of a row decoder 120 or column decoder 130 described with reference to FIG. 1. Decoder 300 may include doped material 310 that extends in a direction away from a surface of the substrate (not shown). Decoder 300 may be an example of a last level decoder of a memory array.

Decoder 300 may include at least first conductive line 305. In some cases, decoder 300 may include a plurality of first conductive lines 305. First conductive line 305 may be configured to carry a voltage that is applied to the access line of the array of memory cells (not shown). For example, each first conductive line 305 may a receive a signal from an access line within decoder 300. First conductive line 305 may extend in a second direction.

In some cases, decoder 300 may include doped materials 310 that may extend between first conductive line 305 and the access line (not shown). For example, doped material 310 may extend in a direction (e.g., first direction) away from the surface of the substrate. In some cases, the direction may be perpendicular or orthogonal to a plane defined by a surface of the substrate. For example, the second direction may be perpendicular to the first direction in which the first conductive line 305 extends. Doped material 310 may be configured to selectively couple first conductive line 305 of decoder 300 with the access line. In some cases, doped material 310 may comprise a semiconductor material such as polysilicon. In some cases, polysilicon may be deposited at a lower temperature than other materials, thereby increasing the compatibility between the polysilicon material of decoder 300 and the memory array.

Decoder 300 may also include contacts 315. Contact 315 may extend between doped material 310 and other conductive lines of the decoder 300 or access lines of the array of memory cells. In some cases, doped material 310 may selectively couple first conductive line 305 of decoder 300 with contact 315. Contact 315 may also extend between conductive material 320 and a second conductive line (not shown).

In some examples, decoder 300 may include at least one conductive material 320. Conductive material 320 may be coupled with doped material 310. In some cases, conductive material 320 may be configured to carry a second voltage (e.g., different voltage than the voltage applied to the access line) for causing doped material 310 to selectively couple first conductive line 305 with the access line the memory array (e.g., array of memory cells). In that case, one or more conductive materials 320 may receive a signal from an access line associated with the memory array. In some cases, the access line may be an example of a word line. Each conductive material 320 may contact to an access line of the memory array.

In some cases, decoder 300 may include one or more transistors. For example, doped material 310 and conductive material 320 may comprise a transistor. The transistor may selectively couple first conductive line 305 with the access line of the memory array. In that case, conductive material 320 may be an example of a gate of the transistor and doped material 310 may be an example of a source of the transistor, a drain of the transistor, or both. In some cases, conductive material 320 may contact an oxide of doped material 310. The transistor may be an example of a nMOS type transistor or a pMOS type transistor. In some cases, polysilicon transistors as decoders may allow for large degree of freedom as compared to polysilicon transistors as selectors in the back-end of the memory array. For example, polysilicon transistors in the front-end of the memory array may allow the use of a higher thermal budget for dopant activation, thereby reducing the device engineering complexity. In some cases, a gate oxide may be positioned between the conductive material 320 and the doped material 310.

In some examples, if decoder 300 includes doped material 310 that extends in a direction away from a surface of the substrate, the size and dimensions of decoder 300 may be optimized. For example, distance 325 between two conductive materials 320 may decrease when a vertical decoder is implemented. In some examples, distance 325 between conductive materials 320 may be 120 nm. In some cases, width 330 of conductive material 320 may also decrease when a vertical decoder is implemented. For example, width 330 of conductive material 320 may be 120 nm. The combined distance 335 of distance 325 and width 330 may be 240 nm. In that case, the combined distance 335 may decrease when a vertical decoder is implemented.

In some cases, distance 340 between two first conductive lines 305 may increase when a vertical decoder is implemented. For example, distance 340 between first conductive lines 305 may be 120 nm. In some cases, width 345 of first conductive line 305 may decrease when a vertical decoder is implemented. For example, width 345 of first conductive line 305 may be 120 nm. The combined distance 350 of distance 340 and width 345 may be 240 nm. In that case, the combined distance 350 may decrease when a vertical decoder is implemented. For example, the area of a nMOS transistor may be 0.015 um$^2$. As described below in further detail, decoder 300 may be viewed via perspective line 355.

Figure 4:
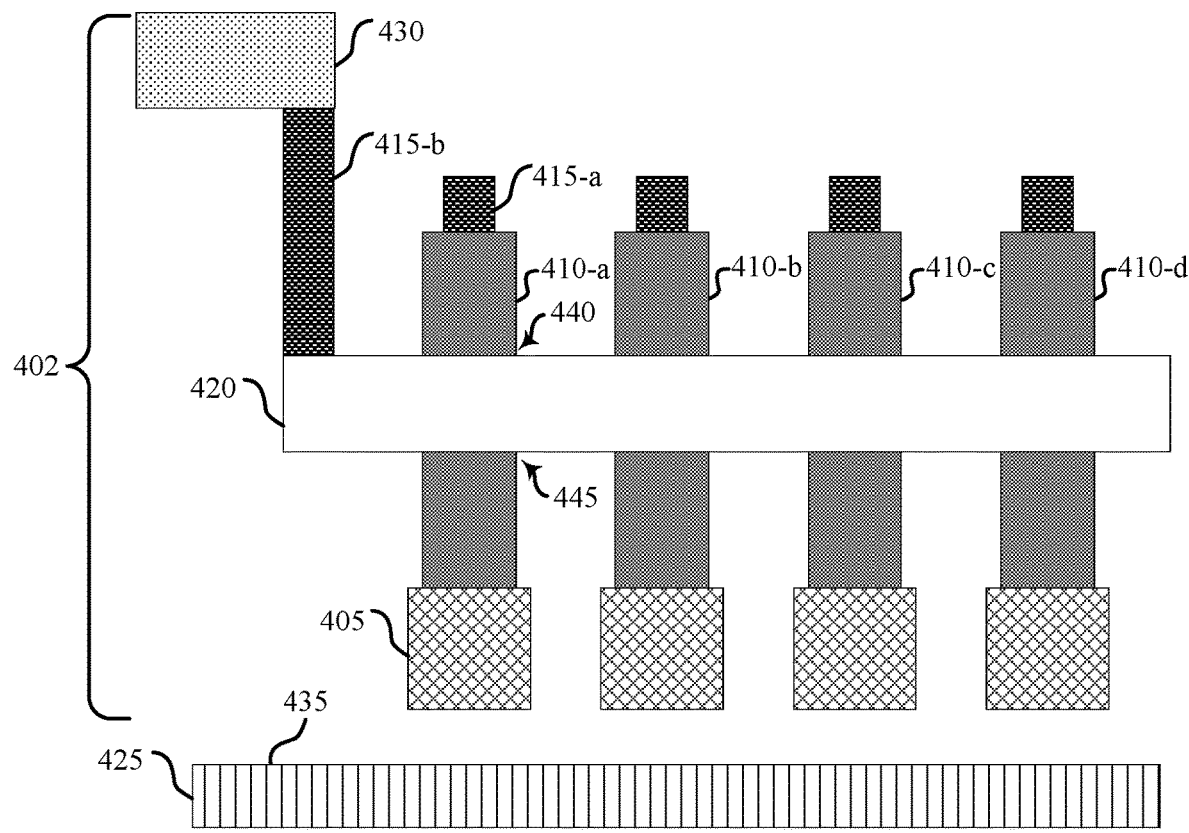
FIG. 4 illustrates an example of a cross-sectional view of a portion of a memory array that supports a vertical decoder as disclosed herein.

FIG. 4 illustrates an example of a cross-sectional view of a portion of a memory array 400 that supports a vertical decoder as disclosed herein. The portion of the memory array 400 may include a decoder 402 that may include doped materials 410-a, 410-b, 410-c, and/or 410-d that extend in a direction away from a surface 435 of the substrate 425. Decoder 402 may be an example of decoder 300 as described with reference to FIG. 3. Doped materials 410-a, 410-b, 410-c, and 410-d may be examples of doped material 310 described with reference to FIG. 3.

The portion of the memory array 400 may include substrate 425, which may be an example of substrate 204 as described in reference to FIG. 2. In some examples, decoder 402 may be coupled with substrate 425. Substrate 425 may be above or below decoder 402. In some cases, decoder 402 may be configured to apply a voltage to an access line of an array of memory cells (e.g., a word line or digit line) as part of an access operation. Decoder 402 may also include first conductive line 405, which may be an example of first conductive line 305 as described in reference to FIG. 3. In some cases, first conductive line 405 may be directly coupled with doped material 410-a.

In some cases, decoder 402 may include doped materials 410-a through 410-d. Doped materials 410-a through 410-d may be a polysilicon material. In some examples, doped materials 410-a through 410-d may extend between first conductive line 405 and the access line of the array of memory cells (e.g., word line or digit line) in a direction away from a surface 435 of substrate 425. For example, doped materials 410-a through 410-d may extend orthogonally from a plane defined by the surface 435 of substrate 425.

In some examples, doped material 410 may be include a first doped region 440 and a second doped region 445. For example, the first doped region 440 may be a first distance away from the surface 435 of substrate 425, and the second doped region 445 may be a second distance away from the surface 435 of substrate 425. In that case, the first distance and the second distance away from the surface 435 of substrate 425 may be different. In some cases, the first doped region 440 and the second doped region 445 may include similarly doped materials. In other examples, the first doped region 440 and the second doped region 445 may include different doped materials. For example, the first doped region 440 may include polysilicon and the second doped region 445 may include a different semiconductor material.

Decoder 402 may include one or more contacts 415 including contacts 415-a and 415-b, which may be examples of contact 315 described in reference to FIG. 3. Contact 415-a may extend between doped material 410-a and the access line of the array of memory cells. In such cases, contact 415-a may be directly coupled with doped material 410-a. In some cases, doped material 410-a may selectively couple first conductive line 405 of decoder 402 with contact 415-a.

Decoder 402 may also include conductive material 420 that may be coupled with doped material 410-a and 410-b, and which may be an example of conductive material 320 as described in reference to FIG. 3. Conductive material 420 may be configured to carry a second voltage for causing doped material 410-a to selectively couple first conductive line 405 with the access line or the contact 415-a. In some cases, conductive material 420 may be directly coupled with a surface of doped material 410-a. For example, conductive material 420 may be coupled with a surface of doped material 410-a. Conductive material 420 may contact an oxide of doped material 410-a. In some examples, conductive material 420 may extend in a direction parallel to the surface of substrate 425. Doped material 410-a may extend in a direction perpendicular to a surface of the conductive material 420.

In some cases, decoder 402 may include second conductive line 430. Second conductive line 430 may be coupled to contact 415-b. For example, contact 415-b may extend between second conductive line 430 and conductive material 420. Second conductive line 430 may carry the second voltage for causing doped material 410-a to couple first conductive line 405 of decoder 402 with the access line. In some cases, contact 415-b may carry the second voltage from second conductive line 430 to conductive material 420 as part of the access operation. Second conductive line 430 may extend in a direction parallel to the surface of substrate 425. In that case, doped material 410-a may extend in a direction perpendicular to a surface of the second conductive line 430. In some cases, the first conductive line 405 may be an example of a global word line or global digit line of the decoder 402 and the second conductive line 430 may be an example of a local word line or a local digit line of the decoder 402.

Figure 5:
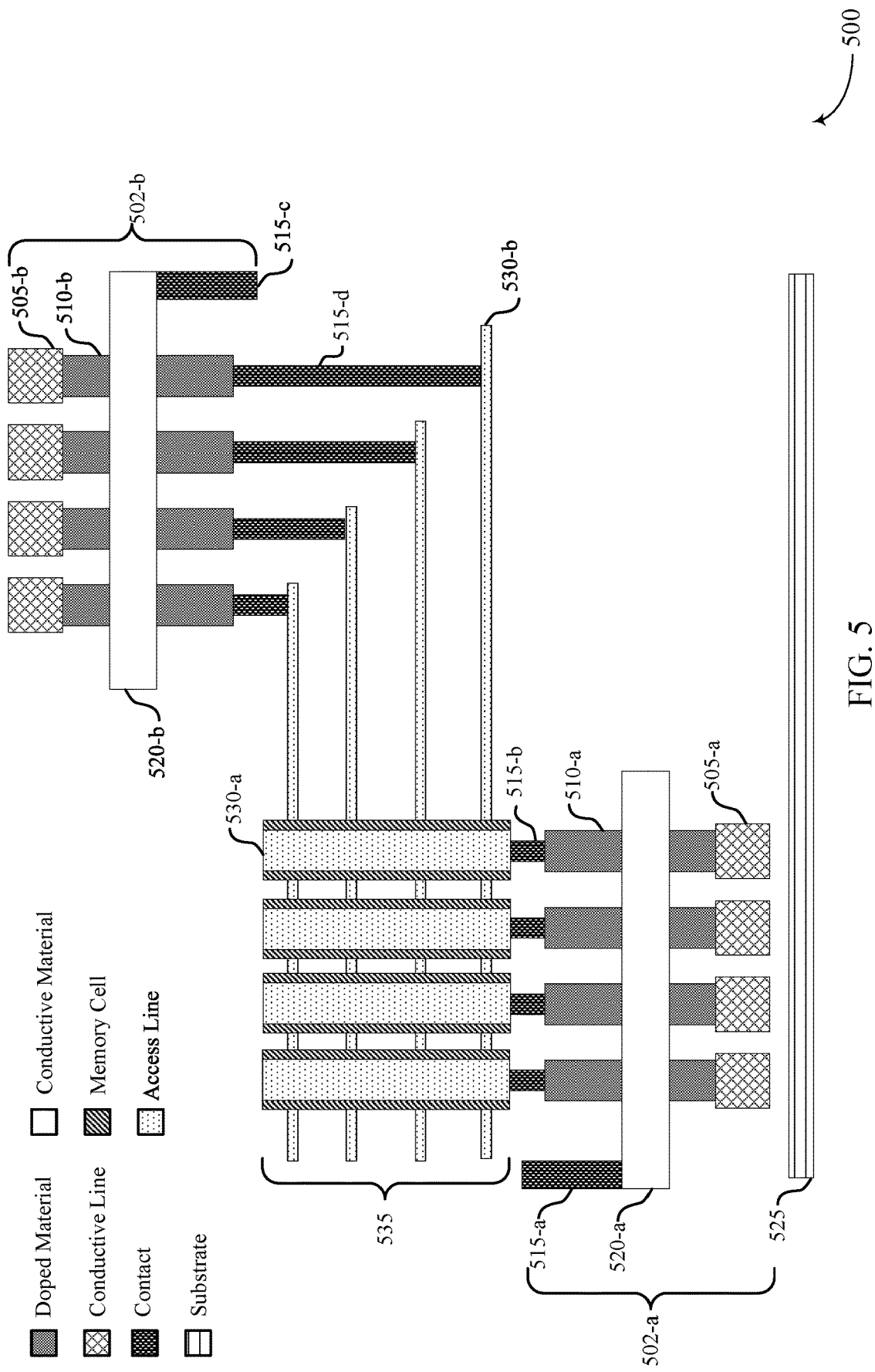
FIGS. 5 and 6 illustrate examples of memory arrays that support a vertical decoder as disclosed herein.

FIG. 5 illustrates an example of a memory array 500 that supports a vertical decoder as disclosed herein. Memory array 500 may include decoders 502-a and 502-b, substrate 525, an array of memory cells 535, and access lines 530-a (e.g., first set of access lines) and 530-b (e.g., second set of access lines). Decoders 502-a and 502-b and substrate 525 may be examples of decoder and substrate, as described in reference to FIGS. 2-4. Memory array 500 may include the array of memory cells 535 coupled with substrate 525. In some cases, the access lines 530-a may comprise word lines or digit lines. In some examples, the access lines 530-b may comprise bit lines or digit lines or word lines. In other examples, memory array 500 may be an example a crosspoint architecture, a pillar architecture, or a planar architecture. Memory array 500 may be an example of an electrical schematic representation.

Decoders 502-a and 502-b may each be an example of a vertical decoder as described herein. Decoder 502-a may be an example of a first decoder (e.g., a row decoder) coupled with substrate 525 and array of memory cells 535. In some cases, decoder 502-a may include a plurality of nMOS transistors. In some cases, decoder 502-a may include conductive lines 505-a (e.g., first conductive line), doped materials 510-a, contacts 515-a, contacts 515-b, and conductive material 520-a, which may be examples of first conductive lines, doped materials, contact, and conductive materials, as described in reference to FIGS. 3 and 4. In some examples, decoder 502-a may be positioned above the array of memory cells 535 (not shown), below the array of memory cells 535, or both.

Decoder 502-*a* may apply a first voltage to an access line (e.g., first access line) of access lines 530-*a* as part of an access operation. Conductive line 505-*a* may carry the first voltage for the for the access operation. In some cases, conductive line 505-*a* may be coupled to the access line of access lines 530-*a* based on applying the first voltage. For example, the contact 515-*a* may carry a signal from another conductive line to cause the first conductive line 505-*a* to be coupled with the access lines 530-*a*. The contacts 515-*b* may couple the doped materials 510-*a* with the access lines 530-*a*. In some cases, access lines 530-*a* may be selected based on activating the first conductive line 505-*a* and the conductive material 520-*a*. The first voltage may also be applied to a memory cell of the array of memory cells 535 based on coupling conductive line 505-*a* to the access line of the access lines 530-*a*. In some cases, a logic state stored in the memory cell of the array of memory cells 535 may be outputted based on applying the first voltage. In that case, the access operation may be a read operation. In some examples, a logic state may be stored in the memory cell of the array of memory cells 535 based on applying the first voltage. In that case, the access operation may be a write operation.

Doped material 510-*a* may extend between conductive line 505-*a* and one of the access lines 530-*a* (or contacts 515-*b*) in a direction perpendicular to the surface of substrate 525. That is, doped material 510-*a* may extend in a direction perpendicular to a surface of conductive material 520-*a*. In some cases, conductive line 505-*a* and access lines 530-*a* may be selectively coupled via doped material 510-*a*.

In some cases, memory array 500 may include decoder 502-*b* which may be an example of a second decoder (e.g., a column decoder). In some cases, decoder 502-*b* may include a plurality of pMOS transistors. For example, decoder 502-*b* may be coupled with substrate 525 and the array of memory cells 535. In some cases, decoder 502-*b* may include conductive lines 505-*b* (e.g., second conductive line), doped materials 510-*b*, contacts 515-*c*, contacts 515-*d*, and conductive material 520-*b*. In some examples, decoder 502-*b* may be positioned above the array of memory cells 535, below the array of memory cells 535 (not shown), or both.

In some cases, fabrication techniques to form memory array 500 may include a different masking step to form each of the different lengths of contacts 515-*d* (e.g., the distance between doped material 510-*b* and access line 530-*b*). In some examples, the contacting scheme may be an example of a staggered configuration. For example, the length of contact 515-*d* may increase as the distance between contact 515-*d* and the array of memory cells 535 increases. In such cases, the bottom access line 530-*b* may extend further than the top access line 530-*b*. The contacting scheme may be implemented via additional conductive layers (not shown). In some examples, a single masking step after deposition may be implemented to obtain the contacting scheme (e.g., staggered configuration).

In some examples, decoder 502-*b* may apply a second voltage to an access line (e.g., second access line) of access lines 530-*b* as part of the access operation. Conductive line 505-*b* may carry a second voltage for selecting a memory cell of the array of memory cells 535 as part of the access operation. The contacts 515-*d* may couple the doped materials 510-*b* with the access lines 530-*b*. In some cases, access lines 530-*b* may be selected based on activating the conductive line 505-*b* and the conductive material 520-*b*. In some cases, the contact 515-*c* may carry a signal from another conductive to cause the first conductive line 505-*b* to be coupled with the access lines 530-*b*. A memory cell included in the array of memory cells 535 may be selected based on the intersection of activated access lines 530-*a* and 530-*b*. For example, the intersection of the first voltage and second voltage may select the memory cell. In that case, the signal applied to the memory cell of the array of memory cells 535 may have a positive or negative polarity.

In some cases, doped material 510-*b* may extend between conductive line 505-*b* and one of the access lines 530-*b* (or contacts 515-*d*) in a direction perpendicular to the surface of substrate 525. Conductive line 505-*b* and access lines 530-*b* may be coupled via doped material 510-*b*.

Figure 6:
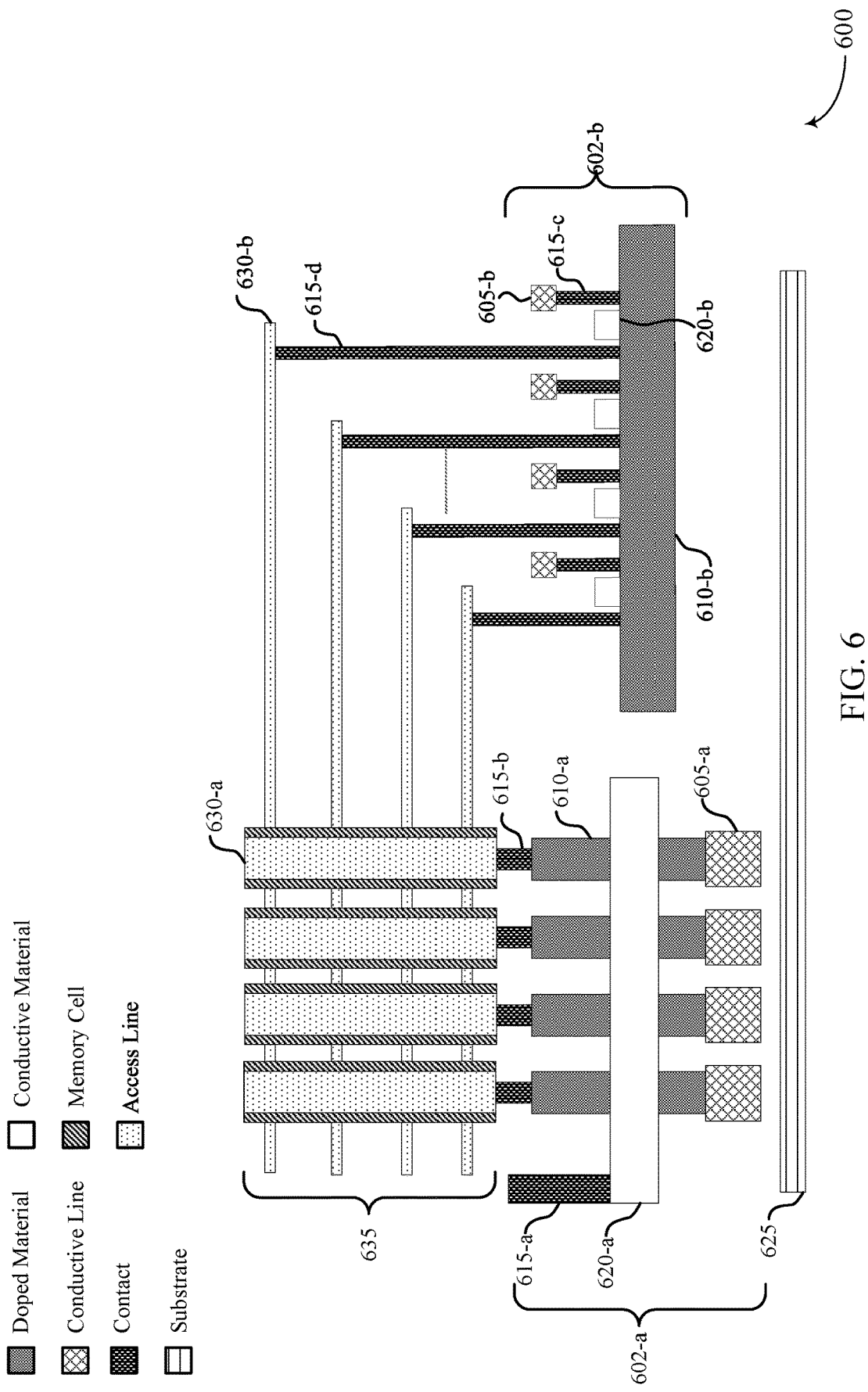

FIG. 6 illustrates an example of a memory array that supports a vertical decoder as disclosed herein. Memory array 600 may include a first decoder 602-*a*, a second decoder 602-*b*, substrate 625, an array of memory cells 635, and access lines 630-*a* (e.g., first set of access lines) and 630-*b* (e.g., second set of access lines). Memory array 600 may include the array of memory cells 635 coupled with substrate 625. In some cases, the access lines 630-*a* may comprise word lines or digit lines. In some examples, the access lines 630-*b* may comprise bit lines or word lines. In other examples, memory array 600 may be an example a cross-point architecture, a pillar architecture, or a planar architecture. Memory array 600 may be an example of memory array 500, as described in reference to FIG. 5.

First decoder 602-*a* may be an example of a vertical decoder as described herein. First decoder 602-*a* may be coupled with substrate 625 and array of memory cells 635. In some cases, first decoder 602-*a* may include a plurality of nMOS transistors or a plurality of pMOS transistors. In some cases, first decoder 602-*a* may include conductive lines 605-*a* (e.g., first conductive line), doped materials 610-*a*, contacts 615-*a*, contacts 615-*b*, and conductive material 620-*a*, which may be examples of first conductive lines, doped materials, contacts, and conductive materials, as described in reference to FIGS. 3-5.

First decoder 602-*a* may apply a first voltage to an access line (e.g., first access line) of access lines 630-*a* as part of an access operation. Conductive lines 605-*a* may carry the first voltage for the for the access operation (e.g., through the contact 615-*b*). Doped materials 610-*a* may extend between conductive line 605-*a* and one of the access lines 630-*a* in a direction perpendicular to the surface of substrate 625. Conductive line 605-*a* and access lines 630-*a* may be coupled via doped material 610-*a*. For example, the contact 615-*a* may carry a signal from another conductive to cause the first conductive line 605-*a* to be coupled with the access lines 630-*a*.

In some cases, memory array 600 may include the second decoder 602-*b* which may be an example of a planar decoder. In some cases, second decoder 602-*b* may include a plurality of pMOS transistors or nMOS transistors. For example, second decoder 602-*b* may be coupled with substrate 625 and the array of memory cells 635. In some cases, second decoder 602-*b* may include conductive lines 605-*b* (e.g., second conductive line), doped materials 610-*b*, contacts 615-*c*, contacts 615-*d*, and conductive material 620-*b*, which may be examples of first conductive lines, doped materials, contacts, and conductive materials, as described in reference to FIGS. 3-5.

In some examples, second decoder 602-*b* may apply a second voltage to an access line (e.g., second access line) of access lines 630-*b* as part of the access operation. Conductive lines 605-*b* may carry a second voltage for selecting a memory cell of the array of memory cells 635 as part of the access operation. In some cases, the doped material 610-*b* may extend parallel to a surface of the substrate 625. The doped material 610-*b* may include a plurality of doped regions that are configured to couple a first conductive line 605-*b* with an access lines 630-*b* based at least in part on a signal applied to one or more of the conductive materials 620-*b*. The contacts 615-*c* may couple the first conductive lines 605-*b* with first doped regions of the doped material 610-*b* and contacts 615-*d* may couple the access lines 630-*b* with second doped regions of the doped material 610-*b*.

Doped material 610-*b* may extend in a direction parallel to the surface of substrate 625. In such cases, doped material 610-*b* may extend in a direction perpendicular to a surface of doped material 610-*a*. Conductive line 605-*b* and access lines 630-*b* may be coupled via doped material 610-*b*. In some cases, the memory array 600 may include a first decoder 602-*a* that includes doped materials 610-*a* that extend in a direction perpendicular to the surface of substrate 625 and a second decoder 602-*b* that includes doped materials 610-*b* that extend in a direction parallel to the surface of substrate 625.

Figure 7A:
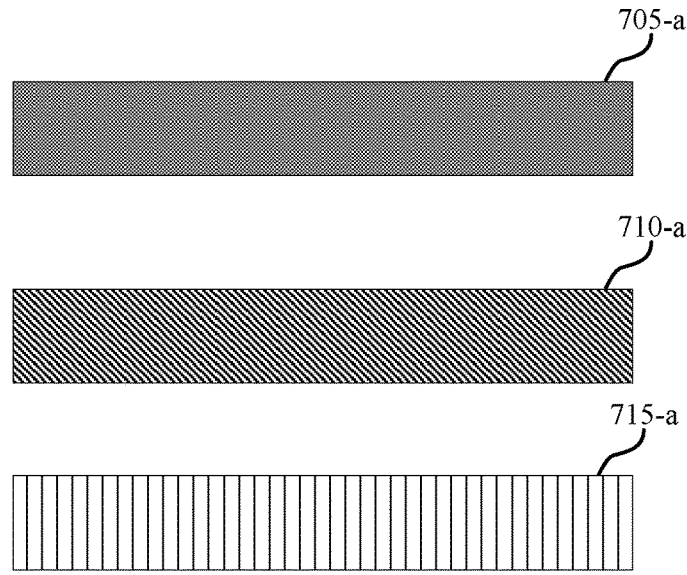
FIGS. 7A and 7B illustrate examples of memory device configurations that support a vertical decoder as disclosed herein.

FIG. 7A illustrates an example of a memory device configuration 700-*a* that supports a vertical decoder as disclosed herein. Memory device configuration 700-*a* may include decoder 705-*a*, array of memory cells 710-*a*, and substrate 715-*a*, which may be examples of a decoder, array of memory cells, and substrate, as described in reference to FIGS. 3-6. In some cases, array of memory cells 710-*a* may be positioned between substrate 715-*a* and decoder 705-*a*.

Figure 7B:
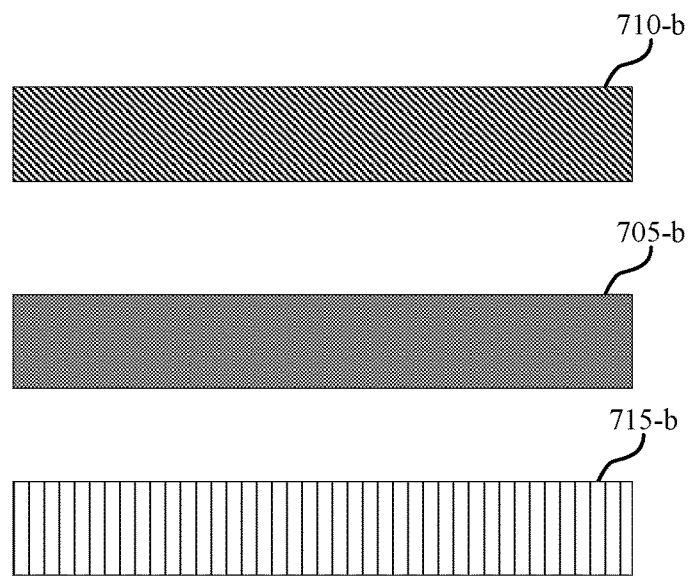

FIG. 7B illustrates an example of a memory device configuration 700-*b* that supports a vertical decoder as disclosed herein. Memory device configuration 700-*b* may include decoder 705-*b*, array of memory cells 710-*b*, and substrate 715-*b*, which may be examples of a decoder, array of memory cells, and substrate, as described in reference to FIGS. 3-6. In some cases, decoder 705-*b* may be positioned between array of memory cells 710-*b* and substrate 715-*b*.

Figure 8:
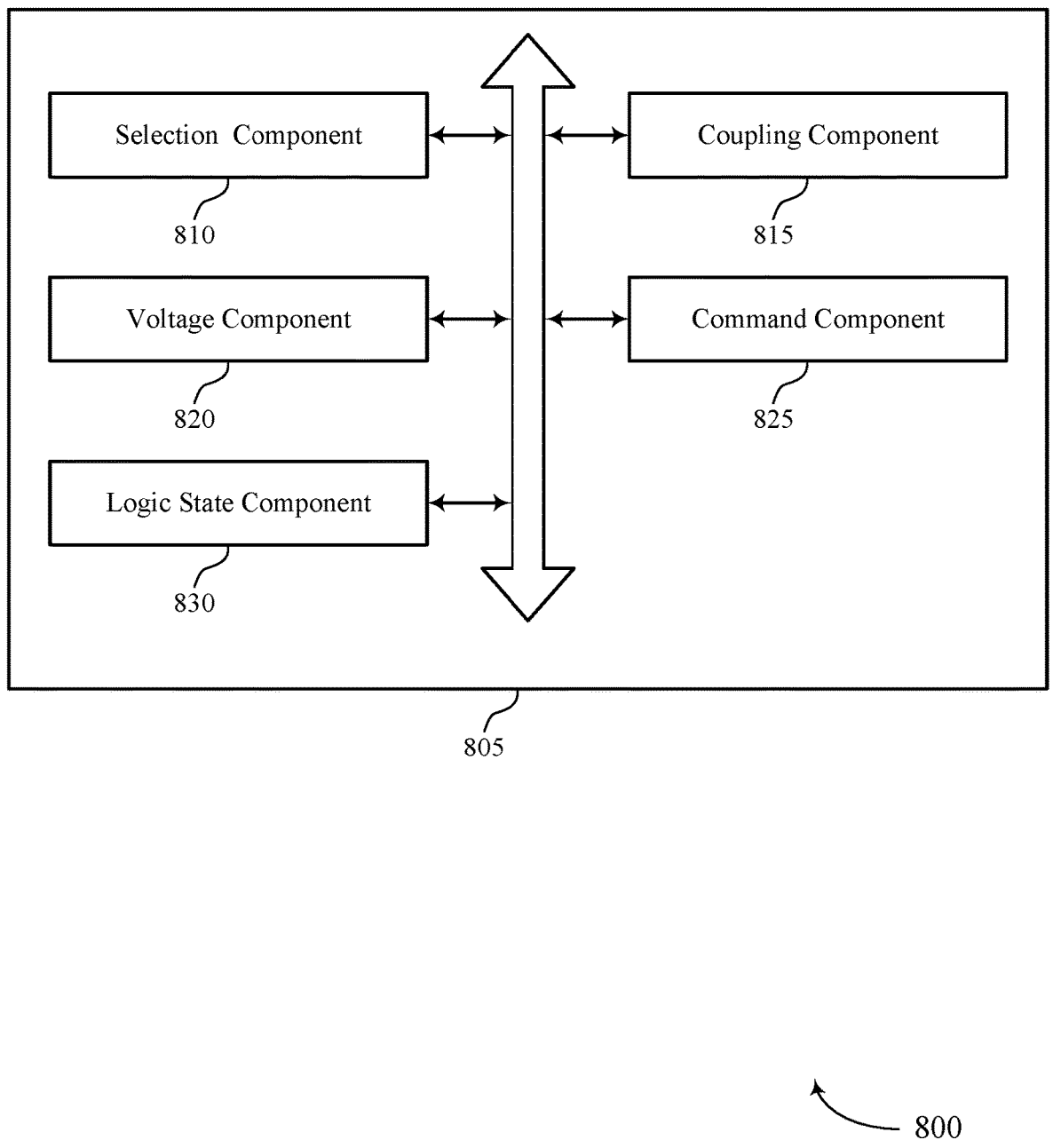
FIG. 8 shows a block diagram of a device that supports a vertical decoder as disclosed herein.

FIG. 8 shows a block diagram 800 of a device 805 that supports a vertical decoder as disclosed herein. In some examples, the device 805 may be an example of a memory array. The device 805 may be an example of portions of a memory controller (e.g., memory controller 140 as described with reference to FIG. 1). The device 805 may include selection component 810, coupling component 815, voltage component 820, command component 825, and logic state component 830. Each of these components may communicate, directly or indirectly, with one another (e.g., via one or more buses).

Selection component 810 may apply a first voltage for selecting a memory cell to a first conductive line of a decoder as part of an access operation of the memory cell. In some examples, selection component 810 may select the memory cell based at least in part on an intersection of the first voltage and the second voltage, wherein a signal applied to the memory cell as part of the access operation has a positive polarity or a negative polarity.

Coupling component 815 may couple, based at least in part on applying the first voltage and using a doped material of the decoder extending between the first conductive line and an access line in a first direction, the first conductive line with the access line associated with the memory cell as part of the access operation.

Voltage component 820 may apply the first voltage to the memory cell as part of the access operation based at least in part on coupling the first conductive line of the decoder with the access line. In some examples, voltage component 820 may apply a second voltage to a second conductive line of the decoder as part of the access operation, the second voltage for causing the doped material to selectively couple the first conductive line of the decoder with the access line associated with the memory cell, wherein applying the first voltage to the memory cell is based at least in part on applying the second voltage to the second conductive line.

Command component 825 may receive a command comprising an instruction to perform the access operation on the memory cell. In some examples, command component 825 may identify an address of the memory cell based at least in part on receiving the command, wherein applying the second voltage to the second conductive line is based at least in part on identifying the address.

Logic state component 830 may output a logic state stored in the memory cell based at least in part on applying the first voltage to the memory cell. In that case, the access operation is a read operation. In some examples, logic state component 830 may store a logic state in the memory cell based at least in part on applying the first voltage to the memory cell. In that case, the access operation is a write operation.

Figure 9:
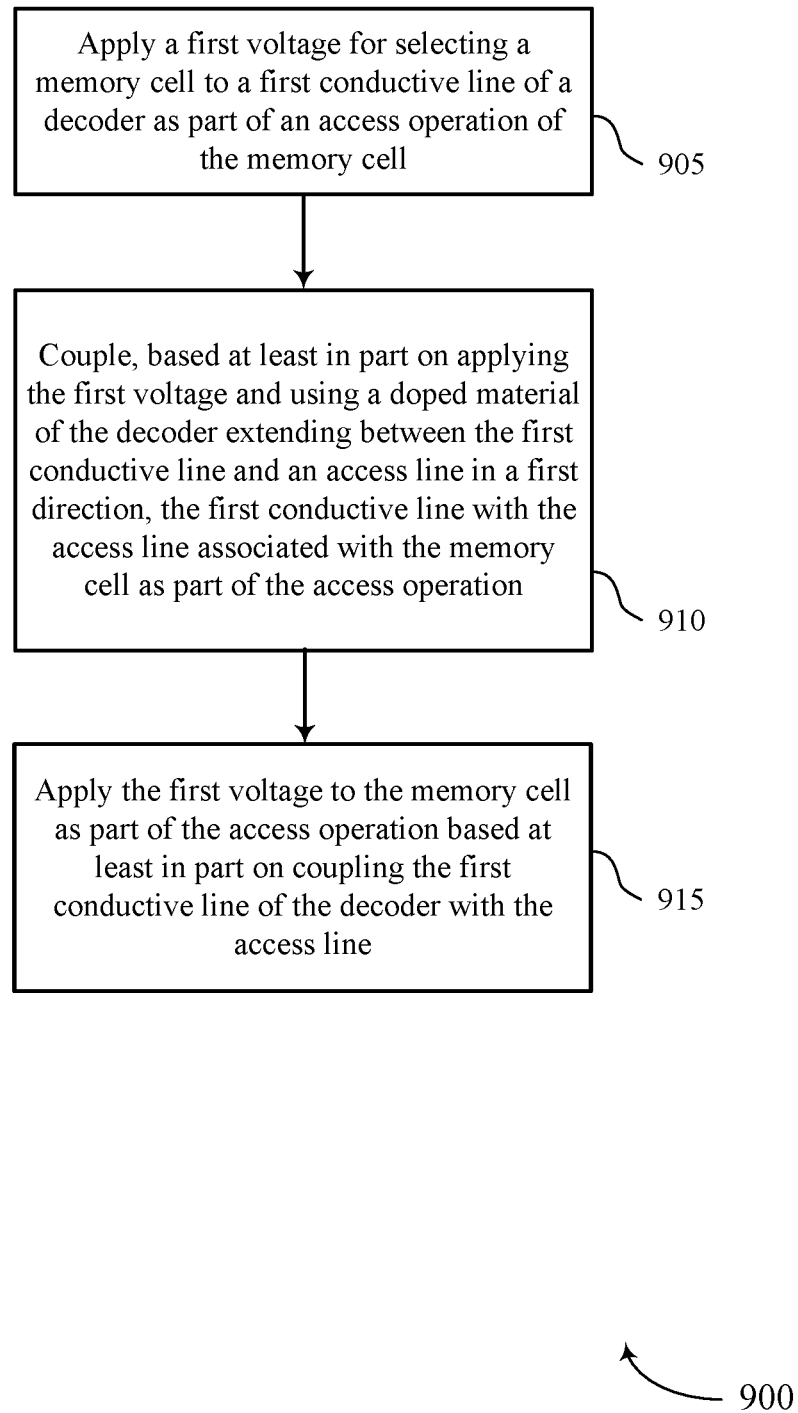
FIGS. 9 and 10 shows a flowchart illustrating a method or methods that support a vertical decoder as disclosed herein.

FIG. 9 shows a flowchart illustrating a method 900 that supports a vertical decoder as disclosed herein. The operations of method 900 may be implemented by a memory controller or its components as described herein. For example, the operations of method 900 may be performed by a memory array as described with reference to FIG. 8 or a memory controller 140 as described with reference to FIG. 1. In some examples, a memory controller may execute a set of instructions to control the functional elements of the memory array to perform the functions described below. Additionally or alternatively, a memory controller may perform portions of the functions described below using special-purpose hardware.

At 905, the memory controller may apply a first voltage for selecting a memory cell to a first conductive line of a decoder as part of an access operation of the memory cell. The operations of 905 may be performed according to the methods described herein. In some examples, portions of the operations of 905 may be performed by a selection component as described with reference to FIG. 8.

At 910, the memory controller may couple, based at least in part on applying the first voltage and using a doped material of the decoder extending between the first conductive line and an access line in a first direction, the first conductive line with the access line associated with the memory cell as part of the access operation. The operations of 910 may be performed according to the methods described herein. In some examples, portions of the operations of 910 may be performed by a coupling component as described with reference to FIG. 8.

At 915, the memory controller may apply the first voltage to the memory cell as part of the access operation based at least in part on coupling the first conductive line of the decoder with the access line. The operations of 915 may be performed according to the methods described herein. In some examples, portions of the operations of 915 may be performed by a voltage component as described with reference to FIG. 8.

Figure 10:
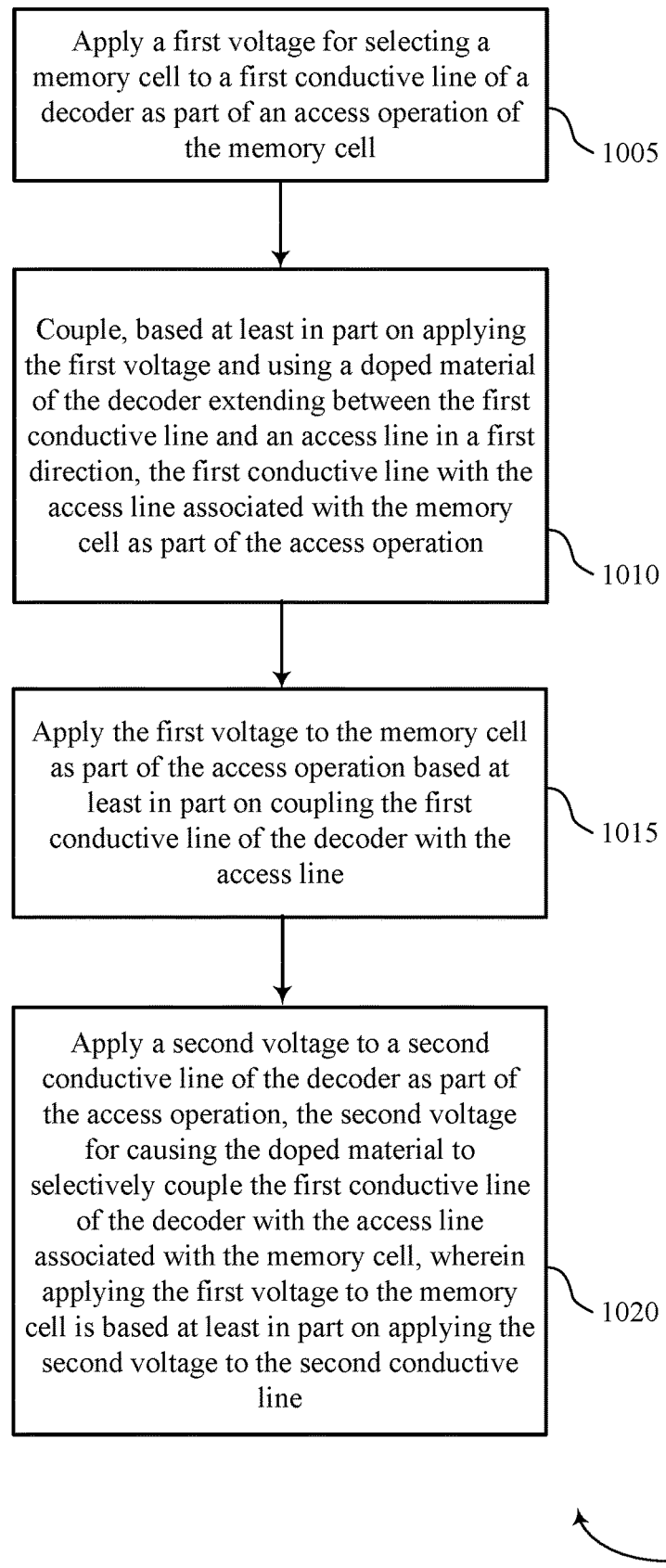

FIG. 10 shows a flowchart illustrating a method 1000 that supports a vertical decoder as disclosed herein. The operations of method 1000 may be implemented by a memory controller or its components as described herein. For example, the operations of method 1000 may be performed by a memory array as described with reference to FIG. 8 or a memory controller 140 as described with reference to FIG. 1. In some examples, a memory controller may execute a set of instructions to control the functional elements of the memory array to perform the functions described below.

Additionally or alternatively, a memory controller may perform portions of the functions described below using special-purpose hardware.

At 1005, the memory controller may apply a first voltage for selecting a memory cell to a first conductive line of a decoder as part of an access operation of the memory cell. The operations of 1005 may be performed according to the methods described herein. In some examples, portions of the operations of 1005 may be performed by a selection component as described with reference to FIG. 8.

At 1010, the memory controller may couple, based at least in part on applying the first voltage and using a doped material of the decoder extending between the first conductive line and an access line in a first direction, the first conductive line with the access line associated with the memory cell as part of the access operation. The operations of 1010 may be performed according to the methods described herein. In some examples, portions of the operations of 1010 may be performed by a coupling component as described with reference to FIG. 8.

At 1015, the memory controller may apply the first voltage to the memory cell as part of the access operation based at least in part on coupling the first conductive line of the decoder with the access line. The operations of 1015 may be performed according to the methods described herein. In some examples, portions of the operations of 1015 may be performed by a voltage component as described with reference to FIG. 8.

At 1020, the memory controller may apply a second voltage to a second conductive line of the decoder as part of the access operation, the second voltage for causing the doped material to selectively couple the first conductive line of the decoder with the access line associated with the memory cell, wherein applying the first voltage to the memory cell is based at least in part on applying the second voltage to the second conductive line. The operations of 1020 may be performed according to the methods described herein. In some examples, portions of the operations of 1020 may be performed by a voltage component as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for applying a first voltage for selecting a memory cell to a first conductive line of a decoder as part of an access operation of the memory cell. The apparatus may include features, means, or instructions (e.g., a non-transitory computer-readable medium storing instructions executable by a processor) for coupling, based at least in part on applying the first voltage and using a doped material of the decoder extending between the first conductive line and an access line in a first direction, the first conductive line with the access line associated with the memory cell as part of the access operation. include features, means, or instructions (e.g., a non-transitory computer-readable medium storing instructions executable by a processor) for applying the first voltage to the memory cell as part of the access operation based at least in part on coupling the first conductive line of the decoder with the access line.

Some examples of the method 1000 and the apparatus described herein may further include operations, features, means, or instructions for applying a second voltage to a second conductive line of the decoder as part of the access operation, the second voltage for causing the doped material to selectively couple the first conductive line of the decoder with the access line associated with the memory cell, wherein applying the first voltage to the memory cell is based at least in part on applying the second voltage to the second conductive line. Some examples of the method 1000 and the apparatus described herein may further include operations, features, means, or instructions for selecting the memory cell based at least in part on an intersection of the first voltage and the second voltage, wherein a signal applied to the memory cell as part of the access operation has a positive polarity or a negative polarity.

Some examples of the method 1000 and the apparatus described herein may further include operations, features, means, or instructions for receiving a command comprising an instruction to perform the access operation on the memory cell. Some examples of the method 1000 and the apparatus described herein may further include operations, features, means, or instructions for identifying an address of the memory cell based at least in part on receiving the command, wherein applying the second voltage to the second conductive line is based at least in part on identifying the address. Some examples of the method 1000 and the apparatus described herein may further include operations, features, means, or instructions for outputting a logic state stored in the memory cell based at least in part on applying the first voltage to the memory cell. Some examples of the method 1000 and the apparatus described herein may further include operations, features, means, or instructions for storing a logic state in the memory cell based at least in part on applying the first voltage to the memory cell.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 102.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a substrate;
   an array of memory cells coupled with the substrate; and
   a decoder coupled with the substrate and configured to apply a voltage to an access line of the array of memory cells as part of an access operation, the decoder comprising:
      a first conductive line configured to carry the voltage applied to the access line of the array of memory cells; and
      a doped material extending between the first conductive line and the access line of the array of memory cells in a first direction away from a surface of the substrate, the doped material configured to selectively couple the first conductive line of the decoder with the access line of the array of memory cells.

2. The memory device of claim 1, further comprising:
   a contact extending between the doped material and the access line of the array of memory cells, wherein the doped material selectively couples the first conductive line of the decoder with the contact.

3. The memory device of claim 2, wherein the doped material is directly coupled with the first conductive line.

4. The memory device of claim 1, wherein the decoder comprises:
   a conductive material coupled with the doped material and configured to carry a second voltage for causing the doped material to selectively couple the first conductive line of the decoder with the access line of the array of memory cells.

5. The memory device of claim 4, wherein the conductive material is directly coupled with a surface of the doped material.

6. The memory device of claim 4, wherein the conductive material extends in a second direction parallel to the surface of the substrate.

7. The memory device of claim 4, wherein the decoder comprises:
   a second conductive line configured to carry the second voltage for causing the doped material to selectively couple the first conductive line of the decoder with the access line of the array of memory cells.

8. The memory device of claim 7, wherein the decoder comprises:
   a contact extending between the second conductive line and the conductive material, the contact configured to carry the second voltage from the second conductive line to the conductive material as part of the access operation.

9. The memory device of claim 4, wherein the doped material and the conductive material comprise a transistor configured to selectively couple the first conductive line of the decoder and the access line of the array of memory cells.

10. The memory device of claim 1, wherein the doped material extends orthogonally from a plane defined by the surface of the substrate.

11. The memory device of claim 1, wherein the doped material has a first doped region and a second doped region, wherein the first doped region is a first distance away from the surface of the substrate and the second doped region is a second distance away from the surface of the substrate different than the first distance.

12. The memory device of claim 1, wherein the doped material is polysilicon.

13. The memory device of claim 1, wherein the array of memory cells comprises self-selecting memory cells.

14. A memory device, comprising:
   a substrate; and
   a decoder coupled with the substrate and configured to select a memory cell as part of an access operation, the decoder comprising:
      a first conductive line configured to carry a voltage for selecting the memory cell as part of the access operation; and
      a doped material extending between the first conductive line and a contact that couples the decoder with the memory cell and configured to selectively couple the first conductive line with the contact as part of the access operation.

15. The memory device of claim 14, wherein the first conductive line is directly coupled with the doped material.

16. The memory device of claim 14, wherein the decoder comprises:
   a conductive material coupled with the doped material and configured to carry a second voltage for causing the doped material to selectively couple the first conductive line of the decoder with the memory cell.

17. The memory device of claim 16, wherein the conductive material extends parallel to a plane defined by a surface of the substrate.

18. The memory device of claim 16, wherein the decoder comprises:
   a second conductive line configured to carry the second voltage for causing the doped material to selectively couple the first conductive line of the decoder with an access line of the memory cell.

19. The memory device of claim 14, wherein the doped material is polysilicon and extends orthogonally from a plane defined by a surface of the substrate.

20. A memory device, comprising:
   a substrate;
   an array of memory cells coupled with the substrate and comprising a first set of access lines and a second set of access lines;
   a first decoder coupled with the substrate and the array of memory cells, the first decoder configured to apply a first voltage to a first access line of the first set as part of an access operation, the first decoder comprising:
      a first conductive line configured to carry the first voltage for the first access line as part of the access operation;
      a doped material extending between the first conductive line and one of the first set of access lines in a first direction perpendicular to a surface of the substrate, the doped material configured to selectively couple the first conductive line with the first access line as part of the access operation; and a second decoder coupled with the substrate and the array of memory cells, the second decoder configured to apply a second voltage to a second access line of the second set as part of the access operation.

21. The memory device of claim 20, wherein the second decoder comprises:
   a second conductive line configured to carry the second voltage for selecting a memory cell of the array of memory cells as part of the access operation; and
   a second doped material extending between the second conductive line and one of the second set of access lines of the array of memory cells in the first direction perpendicular to the surface of the substrate, the second doped material configured to selectively couple the second conductive line with the second access line of the array of memory cells as part of the access operation.

22. The memory device of claim 20, wherein the second decoder comprises:
   a second conductive line configured to carry the second voltage for selecting a memory cell of the array of memory cells as part of the access operation; and
   a second doped material extending in a second direction parallel to the surface of the substrate, the second doped material configured to selectively couple the second conductive line with the second access line of the array of memory cells as part of the access operation.

23. The memory device of claim 20, wherein the first decoder is positioned between the substrate and the array of memory cells.

24. The memory device of claim 20, wherein the array of memory cells is positioned between the substrate and the first decoder.

25. The memory device of claim 20, wherein the first decoder comprises a plurality of nMOS transistors and the second decoder comprises a plurality of a pMOS transistors.

26. The memory device of claim 20, wherein the first set of access lines comprise word lines.

27. The memory device of claim 20, wherein the array of memory cells comprises a cross-point architecture, a pillar architecture, or a planar architecture.

28. A method, comprising:
   applying a first voltage for selecting a memory cell to a first conductive line of a decoder as part of an access operation of the memory cell;
   coupling, based at least in part on applying the first voltage and using a doped material of the decoder extending between the first conductive line and an access line in a first direction, the first conductive line with the access line associated with the memory cell as part of the access operation; and
   applying the first voltage to the memory cell as part of the access operation based at least in part on coupling the first conductive line of the decoder with the access line.

29. The method of claim 28, further comprising:
   applying a second voltage to a second conductive line of the decoder as part of the access operation, the second voltage for causing the doped material to selectively couple the first conductive line of the decoder with the access line associated with the memory cell, wherein applying the first voltage to the memory cell is based at least in part on applying the second voltage to the second conductive line.

30. The method of claim 29, further comprising:
   selecting the memory cell based at least in part on an intersection of the first voltage and the second voltage, wherein a signal applied to the memory cell as part of the access operation has a positive polarity or a negative polarity.

31. The method of claim 29, further comprising:
   receiving a command comprising an instruction to perform the access operation on the memory cell; and
   identifying an address of the memory cell based at least in part on receiving the command, wherein applying the second voltage to the second conductive line is based at least in part on identifying the address.

32. The method of claim 28, wherein the access operation is a read operation, and the method further comprises:
   outputting a logic state stored in the memory cell based at least in part on applying the first voltage to the memory cell.

33. The method of claim 28, wherein the access operation is a write operation, and the method further comprises:
   storing a logic state in the memory cell based at least in part on applying the first voltage to the memory cell.

34. An apparatus comprising:
   a decoder configured to apply a voltage as part of an access operation of a memory cell, the decoder comprising:
      a first conductive line configured to carry the voltage for selecting the memory cell as part of the access operation;
      a doped material coupled with the first conductive line and a contact, the doped material configured to selectively couple the first conductive line with the contact; and
   a controller operable, as part of the access operation of the memory cell, to:
      select the memory cell by applying a first voltage to the first conductive line of the decoder;
      couple the first conductive line of the decoder with an access line associated with the memory cell based at least in part on selecting the memory cell; and
      apply the first voltage to the memory cell based at least in part on coupling the first conductive line of the decoder with the access line.

35. The apparatus of claim 34, wherein the controller is further operable to:
   apply a second voltage to a second conductive line of the decoder as part of the access operation, the second voltage for causing the doped material to selectively couple the first conductive line of the decoder with the access line associated with the memory cell, wherein applying the first voltage to the memory cell is based at least in part on applying the second voltage to the second conductive line.

* * * * *